United States Patent
Yokoyama

(10) Patent No.: US 6,730,854 B2
(45) Date of Patent: May 4, 2004

(54) RESIN-FORMED SUBSTRATE AND RESIN-FORMED SUBSTRATE UNIT

(75) Inventor: Yukio Yokoyama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/270,643

(22) Filed: Oct. 16, 2002

(65) Prior Publication Data

US 2003/0081393 A1 May 1, 2003

(30) Foreign Application Priority Data

Oct. 25, 2001 (JP) ........................................ 2001-327561
Oct. 25, 2001 (JP) ........................................ 2001-327562
Sep. 6, 2002 (JP) ........................................ 2002-261504

(51) Int. Cl.[7] ................................................ H05K 7/04
(52) U.S. Cl. ...................... 174/251; 174/258; 174/260; 361/812; 361/813
(58) Field of Search ................................ 174/251, 258, 174/260; 361/748, 812, 813

(56) References Cited

U.S. PATENT DOCUMENTS 3,978,375 A * 8/1976 Fukui et al. ................. 361/813
5,699,235 A * 12/1997 Tsurumiya et al. .......... 361/803
5,777,851 A * 7/1998 Yamamoto ................... 361/748
6,373,720 B1 * 4/2002 Fechtig et al. ............... 361/823

FOREIGN PATENT DOCUMENTS

JP 2000-133897 5/2000

* cited by examiner

Primary Examiner—John B. Vigushin
(74) Attorney, Agent, or Firm—Fitzpatrick, Cella, Harper & Scinto

(57) ABSTRACT

A resin-formed substrate is provided which has a component side for mounting an electronic component thereon, and a solder side for soldering thereto a lead extending from the electronic component, which is the reverse to the component side, the resin-formed substrate comprising a metal frame forming an electronic circuit pattern; and a resin covering the metal frame, the resin having an aperture formed therein, for exposing a portion of the metal frame, wherein the portion of the metal frame exposed through the aperture serves as an electrode portion for mounting of the electronic component, wherein the resin has a rib integrally formed on the component side, thereby suppressing warp of the resin-formed substrate due to a temperature difference made between a component side and a solder side during soldering.

12 Claims, 6 Drawing Sheets

RESIN-FORMED SUBSTRATE AND RESIN-FORMED SUBSTRATE UNIT

BACKGROUND OF THE INVENTION

1. Field of the Invention

The present invention relates to a resin-formed substrate in which a metal frame patterned in shape of a circuit pattern by press working, etching, or the like is encapsulated with a resin.

2. Related Background Art

In recent years, there are growing demands for miniaturization and extension of functionality of electronic equipment, and technological development is under way toward miniaturization and higher performance of printed circuit boards. Research is being made in high density mounting based on realization of multilayer structures of printed circuit boards and thinner line structures of wiring patterns, and miniaturization is also under way for electronic components themselves to be mounted on the boards. There has been a growth in use of the surface mounting type without leads.

On the other hand, in the case of the printed wiring boards in the field of electronic equipment working with a large electric current like a large inverter control circuit or a primary power circuit, the circuit pattern is formed of a very thin copper foil in the thickness of 0.18 to 0.7 $\mu$m on a glass fabric based epoxy resin or paper based phenolic resin. For this reason, the area of the circuit pattern has to be increased in order to increase the current capacity, and electronic components and wiring patterns have to be set apart from each other over a certain distance in order to ensure sufficient reliability of electrical insulation. These were the hindrance to the development of high density mount technology and delayed the miniaturization of the printed circuit boards with such a large current control as the large inverter control circuit or the primary power circuit, which resulted in hindering the miniaturization of electronic equipment.

Furthermore, the printed circuit boards with the large current control as described above often carry large and heavy electronic components such as inductors, relays, and the like, and frequently suffer such failure that lands (electrode portions) of the printed wiring board with electronic components soldered there are peeled off because of vibration or the like. For securely fixing the electronic components on the printed board, it is possible to use an adhesive. However, this method requires a production process except for soldering and use of the adhesive in addition to solder, which largely increases the processing cost. Therefore, it was not practical.

In order to achieve the miniaturization while overcoming the above problem, there are proposals on a resin-formed substrate such as a resin-molded substrate in which a metal frame having a circuit pattern formed therein is coated with a resin, as described in Japanese Patent Application Laid-Open No. 2000-133897. The resin-formed substrate is formed in such a way that a thin plate of copper-or brass normally about 0.5 mm thick is processed in shape of a desired circuit pattern by press working or etching to obtain a metal frame and that the metal frame is encapsulated with a resin about 1.0 mm thick by insert molding. Since the thickness of the thin plate of copper or brass allowing flow of electric current is larger than those of the ordinary printed wiring boards, it is feasible to construct the large current circuit pattern of a finer pattern and achieve higher density of the circuit pattern. The substrate is also excellent in electrical insulation, because the metal frame is coated with a resin. Accordingly, the substrate of this type is particularly effective to construction of the primary electronic circuit pattern board working with the alternating current of high current intensity like the inverter circuit such as the power circuit pattern or the like.

The injection molding machine with high production efficiency is used in the resin molding for coating the metal frame, and the resin material is normally PPS (polyphenylene sulfide) or PBT (polybutylene terephthalate). Since the metal frame has the lands (electrode portions) for the electronic components to be connected and soldered at predetermined positions, circularly opening land apertures for exposing the lands are provided in the surface of the resin-formed substrate.

A flow soldering technique of implementing soldering with molten solder is used as a method of soldering the electronic components to the resin-formed substrate. The flow soldering technique is a method of blowing the molten solder off over a solder bath, transporting the resin-formed substrate with the electronic components mounted thereon, to over the solder bath, and bringing a solder side as a back surface of the resin-formed substrate into contact with the molten solder blowing off, thereby soldering the leads from the electronic components. In this method, a flux is preliminarily applied onto portions subjected to soldering on the resin-formed substrate, in order to achieve good soldering of the components to the resin-formed substrate. The flux is applied using a flux applying device called a fluxer. Many resin-formed substrates are planar, and the flow soldering technique is normally used for the soldering thereof.

However, while the electronic components are soldered to the resin-formed substrate by the flow soldering technique, the resin-formed substrate is heated only on the solder side thereof by the molten solder blowing off. The resin-formed substrate has a component side for mounting the electronic components thereon, and a solder side for soldering the electronic components thereto, and each of the two sides is coated with a resin about 1.0 mm thick. For this reason, heat on the solder side is hard to transfer to the component side, so that a temperature difference is made between the component side and the solder side. This posed a problem that the resin-formed substrate was warped. This deformation raised significant influence, particularly, when the resin-formed substrate had a large area.

In addition, the resin-formed substrate is difficult to print a component silk thereon, unlike the ordinary printed wiring boards. Therefore, in a step of mounting the electronic components on the resin-formed substrate, it is difficult to specify mounting positions of the electronic components. This might cause mounting of the electronic components at incorrect positions or require a lot of time for specifying the mounting positions, which heavily lowered workability.

In order to achieve secure soldering in the aforementioned flow soldering technique, it is important to preliminarily even the lengths of the leads of the electronic components projecting on the solder side. However, since the lengths of the leads of the electronic components mounted on the resin-formed substrate are different depending upon types and sizes of the electronic components, the leads of the electronic components have to be preliminarily cut in predetermined length before the components are mounted on the resin-formed substrate. The lead cut operation of preliminarily cutting the leads according to the lengths of the leads for the respective electronic components, however, increases the production cost of the resin-formed substrate.

The electronic components can also include a component to which the lead cut operation is applicable with difficulty, e.g., a large electronic component like an interlock relay for large electric current. In this case, it is necessary to provide a space between the electronic component and the resin-formed substrate, to place an insulator between the electronic component and the resin-formed substrate, or to design the mount position of the electronic component on the resin-formed substrate so as to take a long creepage distance for insulation equivalent to the lead cut length. These countermeasures all result in failure in secure mounting of the electronic component, increase in the production cost, and hindrance to the miniaturization of the resin-formed substrate, however.

Meanwhile, in the case where a relatively large component, e.g., an inductor of large diameter, had to be mounted on the resin-formed substrate, it was mounted while lying on its side so as to keep the center of gravity of the inductor low, in order to fix it on a stable basis. However, the component mounted while lying on its side occupied a large area on the resin-formed substrate to hinder the miniaturization of the resin-formed substrate. For mounting the component in the vertical orientation in order to keep down the area on the resin-formed substrate, it is also conceivable to use an adhesive or the like to fix the component. This method, however, requires a production process except for soldering and the adhesive except for solder, thus largely increasing the processing cost.

SUMMARY OF THE INVENTION

It is, therefore, an object of the present invention to provide a resin-formed substrate that makes it possible to suppress occurrence of the warp of the substrate due to the temperature difference between the solder side subjected to soldering, and the component side, without increase in production cost.

Another object of the present invention is to provide a resin-formed substrate that permits secure soldering, regardless of lengths of leads of electronic components to be mounted.

Still another object of the present invention is to provide a resin-formed substrate that makes it feasible to readily specify a mounting position of each electronic component by means of a rib.

According to a first aspect of the present invention, there is provided a resin-formed substrate in which a metal frame forming an electronic circuit pattern is coated with a resin and which comprises a component side for mounting an electronic component thereon, and a solder side for soldering thereto a lead extending from the electronic component, which is the reverse to the component side, wherein the component side is provided with a rib formed of a resin.

In the resin-formed substrate in accordance with the present invention, it is preferred that the rib has an elongated shape extending in a direction perpendicular to an injecting direction of the resin at the time when forming the resin-formed substrate by insert molding.

Further, it is preferred that the rib is formed so as to contour the electronic component to be mounted on the component side.

Moreover, it is preferred that the rib is a seat for the electronic component.

Further, it is preferred that an electrode for mounting the electronic component thereon, and a lead through hole for allowing the lead therethrough to project on the solder side of the resin-formed substrate are formed inside the rib.

Moreover, it is preferred that the height of the rib is adjusted so as to even the lengths of all the leads of the electronic components to be mounted on the resin-formed substrate, projecting from the solder side of the resin-formed substrate.

Further, it is preferred that at least two of the ribs are formed continuously in the direction perpendicular to the conveying direction of the resin-formed substrate at the time when carrying out the flow soldering of the resin-formed substrate.

According to a second aspect of the present invention, there is provided a resin-formed substrate unit comprising the resin-formed substrate and an electronic component mounted on the resin-formed substrate.

In the resin-formed substrate unit in accordance with the present invention, it is preferred that the electronic component is a vertical inductor.

Further, it is preferred that the electronic component is a large relay.

The above and other objects, features, and advantages of the invention will become more apparent from the following detailed description taken in conjunction with the accompanying drawings.

DETAILED DESCRIPTION OF THE PREFERRED EMBODIMENTS

The embodiments of the present invention will be described below in detail with reference to the accompanying drawings.

Figure 1:
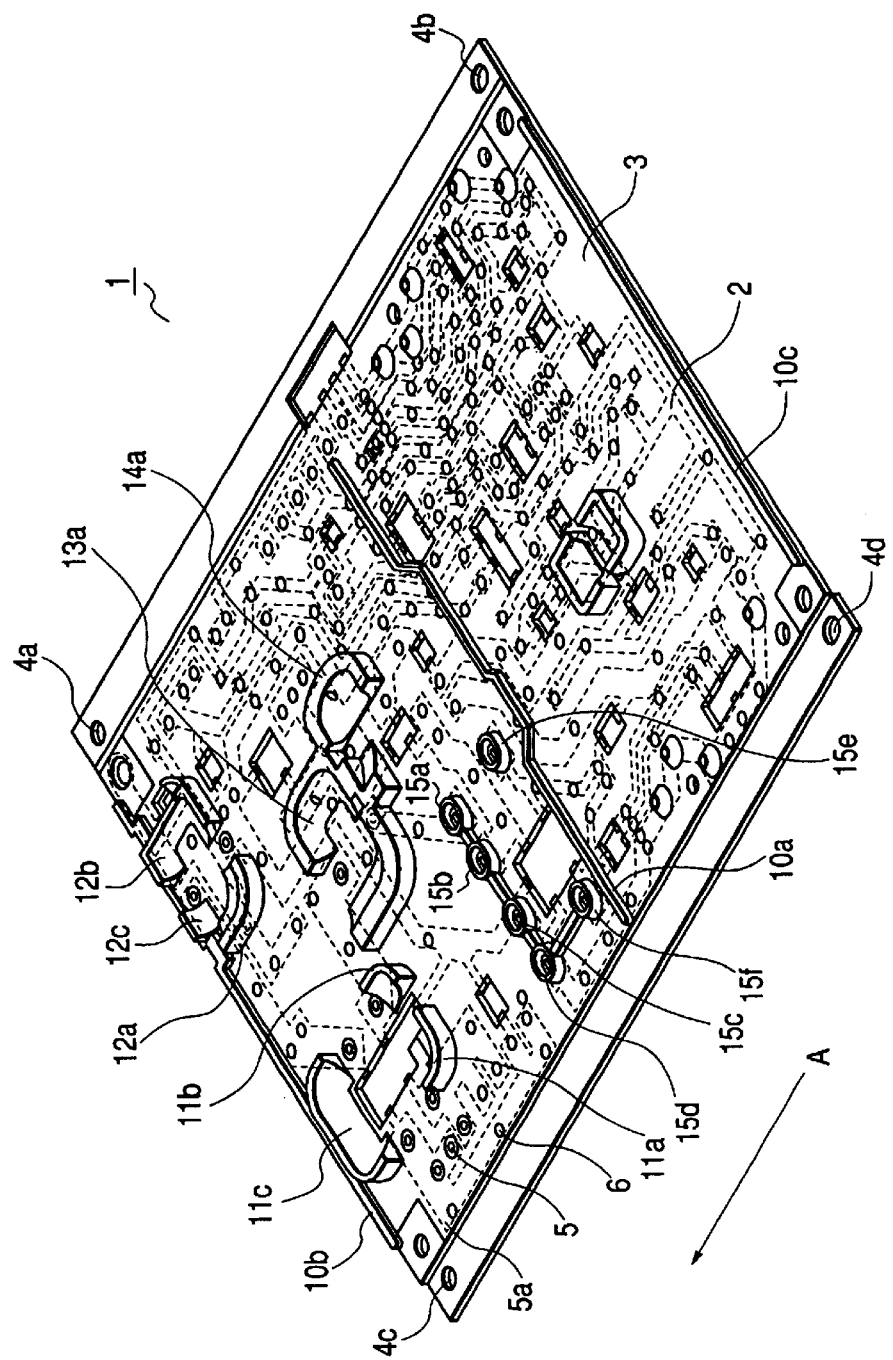
FIG. 1 is a perspective view showing the appearance of a resin-formed substrate.
Figure 2:
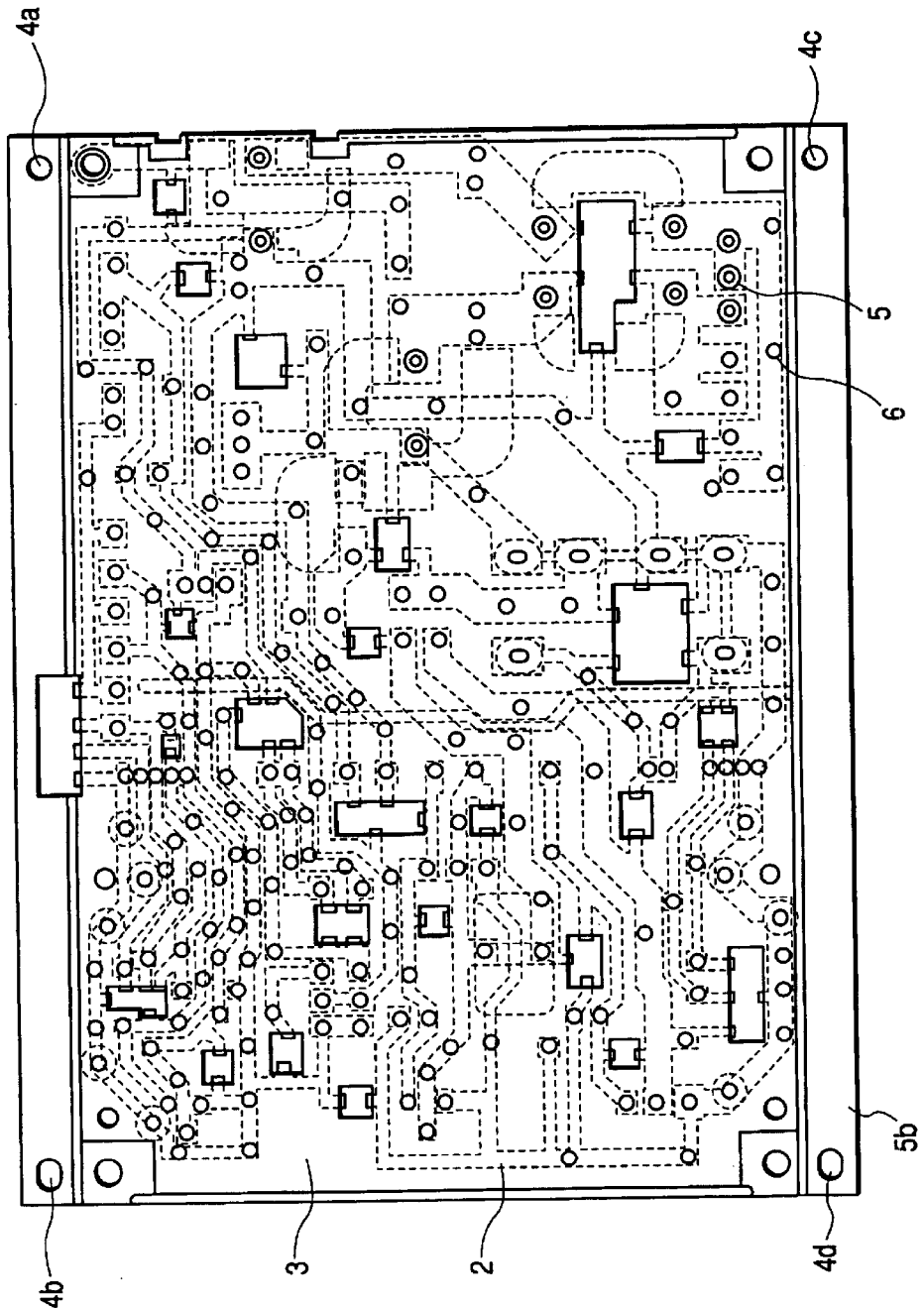
FIG. 2 is a plan view showing the details of the solder side of the resin-formed substrate shown in FIG. 1.
Figure 3:
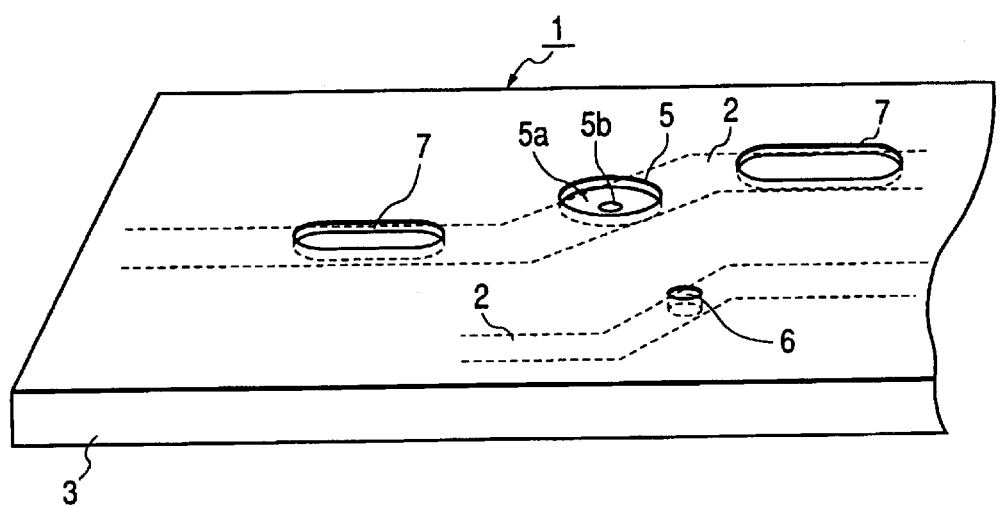
FIG. 3 is a detail view showing a mounting hole in FIG. 1.
Figure 4:
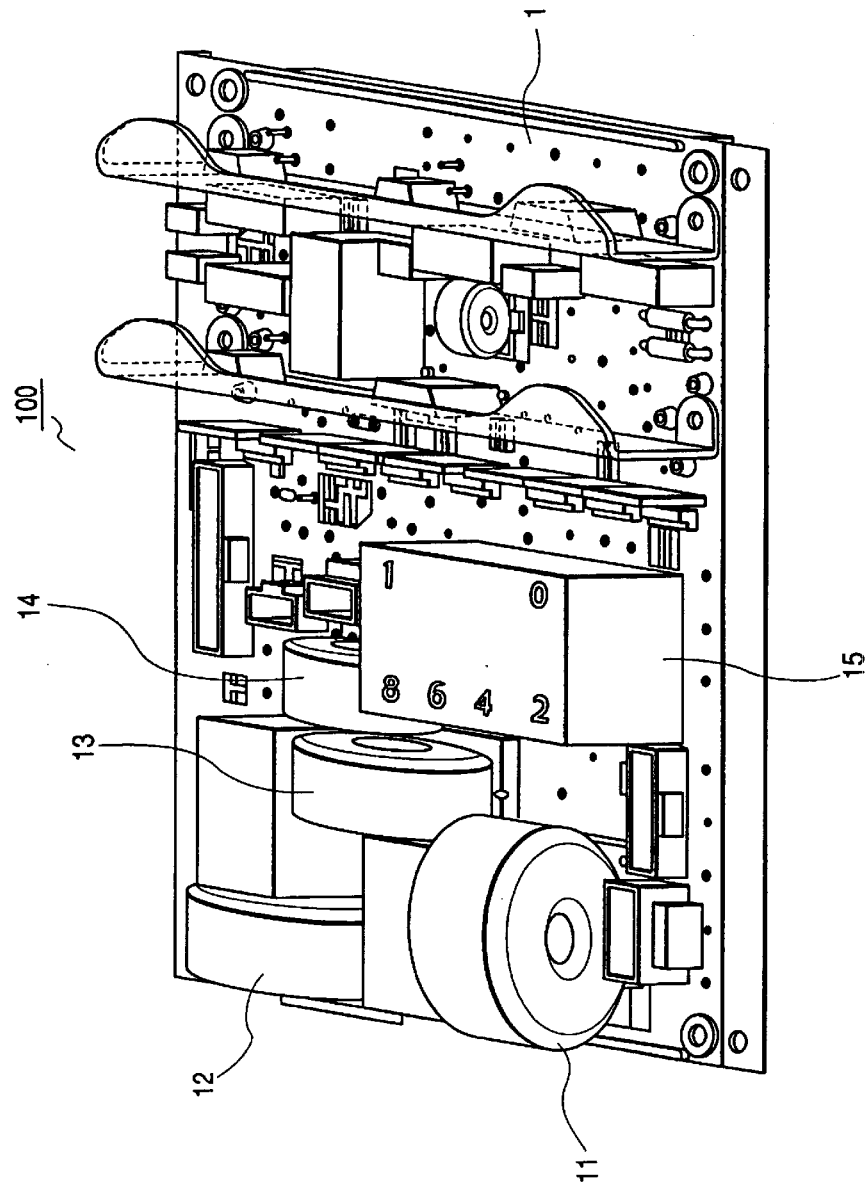
FIG. 4 is a perspective view of a resin-formed substrate unit in which electronic components are mounted on the resin-formed substrate of FIG. 1.

FIG. 1 is a perspective view showing the appearance of the component side for electronic components to be mounted on the resin-formed substrate according to an embodiment of the present invention, and FIG. 2 a plan view showing the details of the solder side for the electronic components to be soldered, which is the reverse to the component side of the resin-formed substrate shown in FIG. 1. FIG. 3 is an enlarged view of a region around a hole formed in the resin-formed substrate. FIG. 4 is an illustration showing the resin-formed substrate unit in which electronic components are mounted on the resin-formed substrate.

In FIGS. 1 and 2, the resin-formed substrate 1 consists of a metal frame 2 forming an electric circuit pattern, and a resin 3 covering the both front and back surfaces of the metal frame 2. However, since the metal frame 2 is covered by the resin 3, it is indicated by dashed lines in the drawings. In the present embodiment the resin-formed substrate will be described in the dimensions of 130 mm long and 190 mm wide. The thickness of the metal frame is normally about 0.5 mm, and the width thereof varies in the range of 1.0 mm to 10.0 mm, depending upon wiring patterns. The thickness of the resin 3 is normally about 1.0 mm both on the component side and on the solder side. Accordingly, the thickness of the resin-formed substrate is normally about 2.5 mm. Symbols 4a, 4b, 4c, and 4d denote mounting holes through which the resin-formed substrate 1 is fixed to a housing or the like of electronic equipment.

A plurality of apertures are bored in the component side and the solder side of the resin-formed substrate 1. The apertures consist of electronic component mounting apertures 5 for mounting of electronic components, and positioning apertures 6 needed in production steps of the resin-formed substrate 1. FIG. 3 is an illustration showing the details of an electronic component mounting aperture 5. The inside diameter of the electronic component mounting aperture 5 is approximately Φ3.0 to 7.0 mm, the metal frame 2 is exposed in part inside the aperture, and the exposed part forms an electrode portion 5a. A lead through hole 5b, into which a lead of an electronic component is to be inserted, is provided in the central region of the electrode portion 5a exposed in the electronic component mounting aperture 5. The inside diameter of the lead through hole 5b is approximately Φ1.0 to 2.6 mm. The electronic component mounting aperture 5 also has an electrode portion similarly in the solder side of the resin-formed substrate. The lead of the electronic component inserted in the lead through hole 5b is soldered to the resin-formed substrate 1 whereby the electronic component is mounted on the resin-formed substrate. In some cases the substrate is also provided with holes as radiating and soaking apertures 7 for controlling the amount of heat in the metal frame 2 in the soldering step.

Symbols 10a, 10b, and 10c represent ribs, which are a feature of the present invention. The rib 10a is formed in the central region of the resin-formed substrate 1, and the ribs 10b, 10c in the two edge regions of the resin-formed substrate 1. In the soldering step by the flow soldering technique, the solder side of the resin-formed substrate 1 is brought into contact with the molten solder of the solder bath, and thus the temperature of the solder side is increased to over 200° C. However, since the resin-formed substrate 1 is covered by the resin 3, the heat on the solder side is not transferred much to the component side, and the temperature of the component side is increased to only about 30 to 50° C. Therefore, the resin-formed substrate 1 would have such a warp as to be warped to the component side because of the difference of thermal contraction of the resin 3 between the component side and the solder side of the resin-formed substrate 1. The resin formed by injection molding has a directional property in the injecting direction of the resin and therefore becomes liable to deform in a direction perpendicular to the injecting direction. In FIG. 1 the arrow A represents the injecting direction of the resin 3 during insert molding. The ribs 10a, 10b, 10c are of elongated shape longer in the direction perpendicular to the direction A, and are formed through the almost entire width of the resin-formed substrate 1. Therefore, the ribs are able to prevent the warp due to the temperature difference between the component side and the solder side of the resin-formed substrate 1. The dimensions of the ribs 10a, 10b, 10c can be determined in the width range of 2.0 to 5.0 mm and the height range of 1.0 to 3.0 mm, depending upon the degree of the warp of the resin-formed substrate 1. In the present embodiment, the ribs 10a, 10b, 10c are dimensioned in the width of 3.0 mm and the height of 1.5 mm. It is, however, noted that ribs of elongated shape longer in the direction parallel to the direction A can present no little effect and, accordingly, that the forming direction of the ribs according to the present invention does not have to be limited to the direction perpendicular to the direction A.

Figure 5:
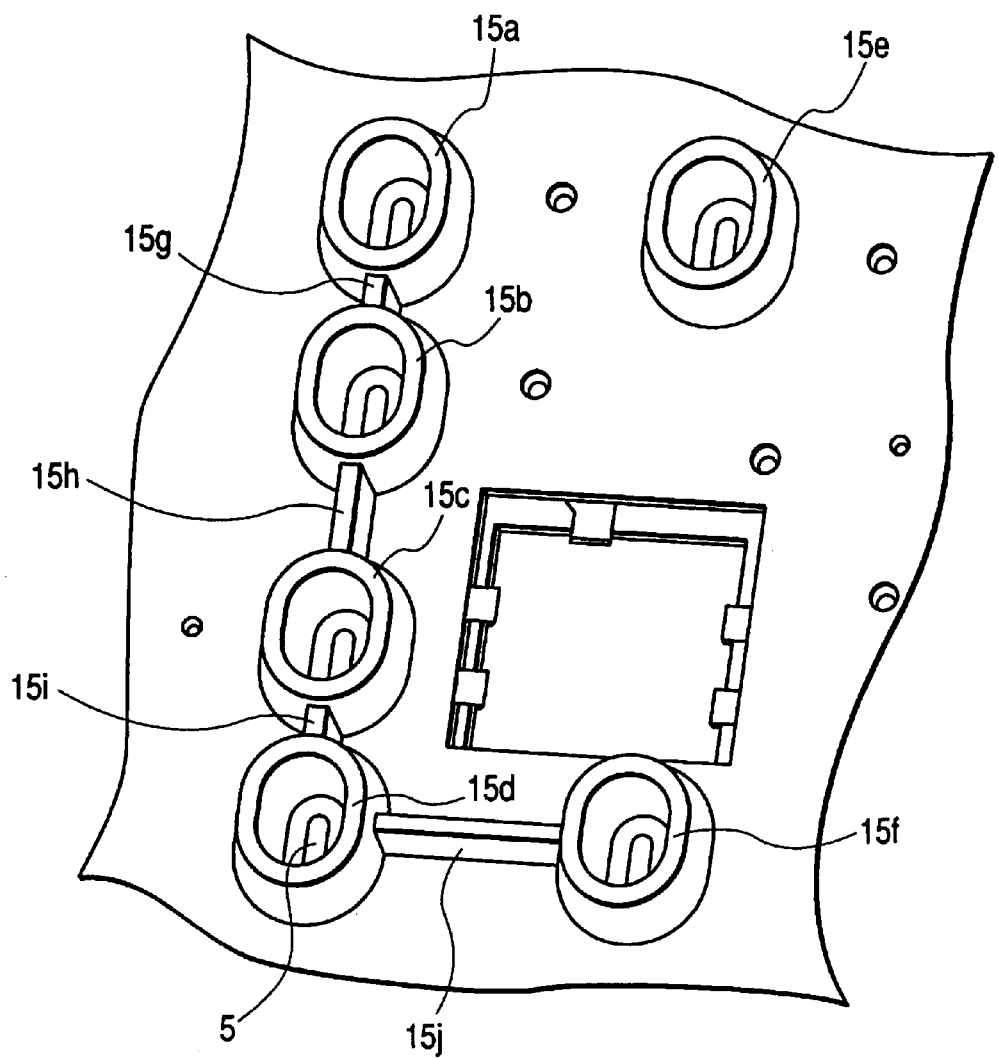
FIG. 5 is a partial enlarged view of the resin-formed substrate shown in FIG. 1.

FIG. 4 is an illustration showing a resin-formed substrate unit 100 in which electronic components are mounted on the resin-formed substrate 1, in which numerals 11, 12, 13, 14 denote inductors, and 15 a large relay. In FIG. 1, symbols 11a, 11b, and 11c represent ribs as a seat for the inductor 11 to be mounted, and symbols 12a, 12b, and 12c ribs as a seat for the inductor 12 to be mounted. Symbol 13a indicates a rib as a seat for the inductor 13 to be mounted, and symbol 14a a rib as a seat for the inductor 14 to be mounted. In the present embodiment the ribs 13a and 14a are continuously shaped. Symbols 15a, 15b, 15c, 15d, 15e, and 15f denote ribs as a seat for the relay 15 to be mounted and, as shown in the enlarged view of FIG. 5, the elliptic ribs 15a, 15b, 15c, 15d, 15f are connected by ribs 15g, 15h, 15i, and 15j. An electronic component mounting hole 5 is formed inside each of the ribs 15a, 15b, 15c, 15d, 15e, and 15f. Inside each electronic component mounting hole 5, as described previously, there are provided an electrode portion 5a of the metal frame 2 exposed in the electronic component mounting hole 5, and a lead through hole 5b which is disposed in the central region of the electrode portion 5a and into which the lead of the, electronic component is to be inserted.

The ribs 11a, 11b, 11c, 12a, 12b, 12c, 13a, 14a, 15a, 15b, 15c, 15d, 15e, 15f, 15g, 15h, 15i, 15j are shaped to fit the contours of the individual electronic components so that the electronic components mounted on the resin-formed substrate 1 can be securely fixed. For example, the ribs for the inductor 11 consist of the members having three corner portions 11a, 11b, 11c and are shaped so that the outer peripheral side of the vertical inductor 11 is seated inside. The ribs for the large relay 15 consist of the six ribs 15a, 15b, 15c, 15d, 15e, 15f formed in shape of a nearly elliptic frustum and with the respective electronic component mounting holes 5 inside, and the ribs 15g, 15h, 15i, 15j formed continuously between the ribs 15a, 15b, 15c, 15d, 15f, and the large relay 15 is mounted on the resin-formed substrate 1 so as to be seated on the top surfaces of these six ribs 15a, 15b, 15c, 15d, 15e, 15f.

By employing the ribs shaped as described above, even for the resin-formed substrate which is difficult to print a component silk thereon, it is feasible to readily specify the correct mounting locations of the electronic components in the step of mounting the electronic components on the resin-formed substrate, so that there is no fear of mounting the electronic components at incorrect mounting locations or taking a long period of time for identifying the correct mounting locations, which prevents the lowering in workability.

The ribs 11a, 11b, 11c, 12a, 12b, 12c, 13a, 14a, 15a, 15b, 15c, 15d, 15e, 15f, 15g, 15h, 15i, 15j also function to prevent the warp due to the temperature difference between the component side and the solder side in the flow soldering step of the resin-formed substrate 1 as the ribs 10a, 10b, 10c described previously did. The heights of the ribs 11a, 11b, 11c, 12a, 12b, 12c, 13a, 14a, 15a, 15b, 15c, 15d, 15e, 15f are determined depending upon the lengths of the leads of the electronic components to be mounted and are normally about 3.0 mm. The ribs 15g, 15h, 15i, 15j are formed in the height a little lower than the ribs 15a, 15b, 15c, 15d, 15e, 15f and are set in the height of 2.5 mm in the present embodiment.

By adjusting the heights of the ribs 11a, 11b, 11c, 12a, 12b, 12c, 13a, 14a, 15a, 15b, 15c, 15d, 15e, 15f, it is feasible to keep constant the projecting lengths of all the leads of the inductors 11, 12, 13, 14 and the large relay 15 on the solder side of the resin-formed substrate 1, whereby soldering can be achieved more securely. Since the heights of the ribs can be determined by designing the shape of a die for molding of the resin 3 by insert molding, corresponding to the lengths of the leads of the components to be mounted, the adjustment of the heights is readily implementable without increase in the number of production steps and without need for an extra member.

Figure 6:
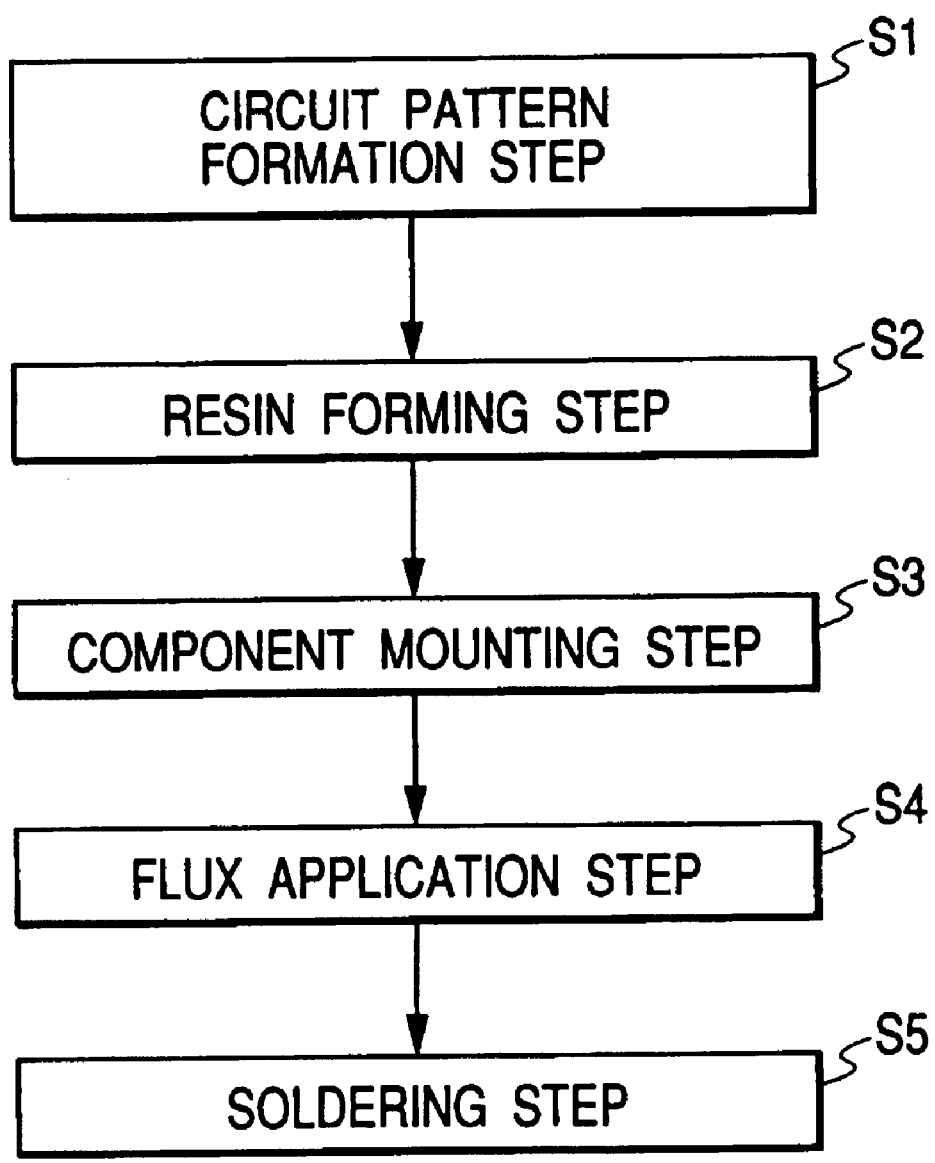
FIG. 6 is a flowchart showing a production process of the resin-formed substrate.

Production steps of the resin-formed substrate unit 100 will be described below in order. FIG. 6 is a flowchart showing the production steps of the resin-formed substrate unit 100.

The first step S1 is to form a circuit pattern comprised of the metal frame 2. A base material of the metal frame 2 is a copper sheet 200 mm long, 150 mm wide, and 0.5 mm thick. The copper sheet is processed into the desired circuit pattern by press working or etching to form the metal frame 2. In this step, the holes are bored in the diameter of φ1 to 2.6 mm and at the predetermined positions on the copper sheet according to the circuit pattern, to form the lead through holes 5a for the leads of the electronic components to be inserted thereinto.

The next step S2 is a resin forming step of coating the metal frame 2 with the resin 3. In this resin forming step, the metal frame 2 formed in the circuit pattern is positioned in the die, and the resin 3 is injected in the direction A on the metal frame 2 by insert molding, using an injection molding machine (not shown). The die used in this step is one preliminarily processed so as to have the shapes corresponding to the electronic component mounting holes 5 for mounting of the electronic components, the positioning holes 6, and the ribs 10a, 10b, 10c, 11a, 11b, 11c, 12a, 12b, 12c, 13a, 14a, 15a, 15b, 15c, 15d, 15e, 15f, 15g, 15h, 15i, 15j. In this respect, as described previously, the heights of the ribs 11a, 11b, 11c, 12a, 12b, 12c, 13a, 14a, 15a, 15b, 15c, 15d, 15e, 15f are adjusted so as to approximately even the projecting lengths of the leads on the solder side for all the leads of the electronic components in the work of inserting the leads of the electronic components into the lead through holes 5a in the electronic component mounting holes 5 provided on the component side of the resin-formed substrate 1 and mounting the electronic components on the substrate. The resin used herein is PPS (polyphenylene sulfide) which is a thermoplastic resin, and CTI (Comparative Tracking Index) thereof is 170.

The next step S3 is a component mounting step of mounting the electronic components on the resin-formed substrate 1. In this component mounting step, the leads of the electronic components are inserted into the lead through holes 5b in the electronic component mounting apertures 5 provided on the resin-formed substrate 1, by an automatic machine or by hand, to mount the electronic components on the resin-formed substrate 1. Since in the present embodiment the ribs express the contours of the components to be mounted, a worker is able to readily identify which leads of the electronic components should be inserted into which electronic component mounting apertures 5. For example, the worker is able to readily recognize that the ribs 11a, 11b, 11c are provided for fixing the vertical inductor 11 and the seats 15a, 15b, 15c, 15d, 15e, 15f for fixing the large relay 15. When the electronic components are mounted on the component side of the resin-formed substrate 1, the mounting work ends in approximately evening the lengths of the leads of the electronic components projecting out of the lead through holes 5b in the electronic component mounting apertures 5 provided on the solder side of the resin-formed substrate 1.

The next step S4 is a flux applying step of applying the flux to ensure good soldering on the solder side of the resin-formed substrate 1 with the electronic components thereon. In this flux applying step, the flux is preliminarily applied to the electrode portions of the solder side subjected to soldering, using the flux applying device called the fluxer.

The last step S5 is a soldering step of the resin-formed substrate 1. In the present embodiment, the soldering is performed by the flow solder method using the molten solder for soldering (the flow soldering technique). In this flow soldering technique, the molten solder is blown off out of the solder bath, and the solder side of the resin-formed substrate 1 conveyed by a conveyer is brought into contact with the molten solder, thereby effecting soldering. The electronic components are electrically connected and fixed to the resin-formed substrate 1 by the flow soldering technique, as shown in aforementioned FIG. 4.

As described above, according to the present invention, in a resin-formed substrate in which a resin is formed on a metal frame that forms an electronic circuit pattern, by providing a surface of the resin-formed substrate with a rib, it is feasible to suppress the warp of the resin-formed substrate due to a temperature difference made between the component side and the solder side during soldering. Further, when the rib has an elongated shape extending in a direction perpendicular to an injecting direction of the resin, the effect of suppressing the warp can be enhanced.

Moreover, the resin-formed substrate according to the present invention may be formed such that the aforementioned rib also serves as a seat for mounting an electronic component thereon. At this time, by adjusting the heights of the seats, it is feasible to readily even the lengths of the leads of the electronic components projecting from the soldering face of the resin-formed substrate and it becomes feasible to fix the electronic components securely by soldering, without need for the lead cut operation. It also becomes feasible to readily fix an electronic component to which the lead cut operation is applicable with difficulty. Further, by forming the rib so as to contour the component, even for the resin-formed substrate which is difficult to print a component silk thereon, it is feasible to readily specify the correct mounting locations of the electronic components in the step of mounting the electronic components on the resin-formed substrate, so that there is no fear of mounting the electronic components at incorrect mounting locations or taking a long period of time for identifying the correct mounting locations, which prevents the lowering in workability.

What is claimed is:

1. A resin-formed substrate having a component side for mounting an electronic component thereon, and a solder side for soldering thereto a lead extending from the electronic component, which is the reverse to the component side, the resin-formed substrate comprising:

a metal frame forming an electronic circuit pattern; and a resin covering the metal frame, the resin having an aperture formed therein for exposing a portion of the metal frame, wherein the portion of the metal frame exposed through the aperture serves as an electrode portion for mounting of the electronic component, wherein the resin has a rib integrally formed on the component side, and wherein the rib has an elongated shape and is formed over substantially the entire width of the resin.

2. A resin-formed substrate unit comprising:

a plurality of electronic components; and a resin-formed substrate having a component side for mounting the electronic components thereon, and a solder side which is the reverse to the component side, the resin-formed substrate comprising a metal frame forming an electronic circuit pattern, and a resin covering the metal frame, wherein apertures are formed in the resin, for exposing portions of the metal frame, wherein the portions of the metal frame exposed through the apertures are electrode portions, wherein the electronic components are mounted on the electrode portions and leads extending from the electronic components are soldered to the solder side, wherein the resin has a rib integrally formed on the component side, and wherein the rib has an elongated shape and is formed over substantially the entire width of the resin.

3. A resin-formed substrate having a component side for mounting an electronic component thereon, and a solder side for soldering thereto a lead extending from the electronic component, which is the reverse to the component side, the resin-formed substrate comprising:

a metal frame which forms an electronic circuit pattern; and a resin covering the metal frame, wherein the resin has an aperture formed therein for exposing a portion of said metal frame, wherein the portion of the metal frame exposed through the aperture serves as an electrode portion for mounting of the electronic component, wherein the resin has a rib integrally formed on the component side, and wherein the rib is a seat for placing the electronic component thereon and is formed so as to contour the electronic component.

4. The resin-formed substrate according to claim 3, wherein an electrode portion for mounting the electronic component thereon, and a lead through-hole for allowing the lead to project through to the solder side of the resin-formed substrate are formed inside a region surrounded by the rib.

5. The resin-formed substrate according to claim 4, wherein the height of the rib is adjusted so as to even projecting lengths of the leads of all the electronic components, which project on the solder side of the resin-formed substrate.

6. The resin-formed substrate according to claim 3, which is formed by insert molding, wherein at least two said ribs are formed continuously in a direction perpendicular to an injecting direction of the resin.

7. A resin-formed substrate unit comprising:

a plurality of electronic components; and a resin-formed substrate having a component side for mounting the electronic components thereon, and a solder side which is the reverse to the component side, the resin-formed substrate comprising a metal frame forming an electronic circuit pattern, and a resin covering the metal frame, wherein apertures are formed in the resin, for exposing portions of the metal frame, wherein the portions of the metal frame exposed through the apertures are electrode portions, wherein said plurality of electronic components are mounted on the electrode portions, wherein leads extending from said plurality of electronic components are soldered to the solder side, wherein the resin has a rib integrally formed on the component side, and wherein the rib is a seat for placing the electronic component thereon, and the rib is formed so as to contour the electronic component.

8. The resin-formed substrate unit according to claim 7, wherein electrode portions for mounting the electronic components thereon, and lead through holes for allowing the leads to project through to the solder side of the resin-formed substrate are formed inside a region surrounded by the rib.

9. The resin-formed substrate unit according to claim 8, wherein the height of the rib is adjusted so as to even projecting lengths of the leads of all the electronic components, which project on the solder side of the resin-formed substrate.

10. The resin-formed substrate unit according to claim 9, wherein one of said plurality of electronic components is a vertical inductor.

11. The resin-formed substrate unit according to claim 9, wherein one of said plurality of electronic components is a large relay.

12. The resin-formed substrate unit according to claim 7, wherein the resin-formed substrate is formed by insert molding, and wherein at least two said ribs are formed continuously in a direction perpendicular to an injecting direction of the resin.

* * * * *